US006764967B2

(12) United States Patent
Pai et al.

(10) Patent No.: US 6,764,967 B2
(45) Date of Patent: Jul. 20, 2004

(54) METHOD FOR FORMING LOW THERMAL BUDGET SACRIFICIAL OXIDES

(75) Inventors: Vincent Pai, Hsin-Chu (TW); Kuo-Chi Tu, Hsin-Chu (TW); Chung-Wei Chang, Hsin-Chu (TW); Chia-Shiung Tsai, Hsin-Chu (TW); Chun-Yao Chen, Hsin-Chu (TW)

(73) Assignee: Taiwan SEmiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/264,489

(22) Filed: Oct. 5, 2002

(65) Prior Publication Data

US 2004/0067639 A1 Apr. 8, 2004

(51) Int. Cl.[7] .................... H01L 21/31; H01L 21/469
(52) U.S. Cl. .................................. 438/787; 438/906
(58) Field of Search ........................... 438/673, 674, 438/680, 723, 743, 756, 719, 905, 906

(56) References Cited

U.S. PATENT DOCUMENTS

| | | | | |
|---|---|---|---|---|
| 4,371,587 A | * | 2/1983 | Petres | 428/446 |
| 4,474,829 A | * | 10/1984 | Petres | 427/53.1 |
| 4,886,765 A | * | 12/1989 | Chen et al. | 438/680 |
| 5,043,299 A | * | 8/1991 | Chang et al. | 438/787 |
| 6,201,226 B1 | * | 3/2001 | Shimada et al. | 250/201.3 |

\* cited by examiner

*Primary Examiner*—David Nhu
(74) *Attorney, Agent, or Firm*—Tung & Associates

(57) ABSTRACT

A method for forming a silicon dioxide layer over a silicon substrate including providing a substrate having exposed silicon portions; and, forming a silicon dioxide layer over the exposed silicon portions according to an oxide formation process including contacting the exposed silicon portions with an oxidizing solution comprising water and ozone.

14 Claims, 2 Drawing Sheets

METHOD FOR FORMING LOW THERMAL BUDGET SACRIFICIAL OXIDES

FIELD OF THE INVENTION

The present invention relates generally to CMOS device fabrication processes and, more particularly, to a method of for fabricating sacrificial oxide layers at a low thermal budget to avoid undesired thermally induced diffusion of doped regions and to reduce defect levels in a silicon substrates thereby improving semiconductor device performance.

BACKGROUND OF THE INVENTION

Fabrication of metal-oxide-semiconductor (MOS) integrated circuits involves numerous processing steps. A gate dielectric, typically formed from silicon dioxide, is typically formed on a silicon semiconductor substrate having a channel region which is doped with either n-type or p-type impurities. For example, in the formation of a MOS field effect transistor (MOSFET) the gate structure is formed by first forming a gate dielectric over the silicon substrate followed by the formation of a polysilicon or other conducting material gate electrode over the gate dielectric. Dopant impurities are then introduced into the silicon substrate to form various doped regions including source and drain regions. A pervasive trend in modern integrated circuit manufacture is to produce transistors having feature sizes as small as possible. Many modern integrated circuit microelectronic devices employ features having critical dimensions of Less than 0.25 microns requiring a concomitant scaling down of feature sizes such as gate structures. For example, many modern integrated circuit microelectronic processes are now producing semiconductor devices having CD's of less than 0.13 microns. As device sizes decrease, the size of device components such as transistors, including gate oxide thickness, also decreases. Fabrication of smaller device components allows more device components to be placed on a given substrate area, Thereby allowing relatively large integrated circuit systems to be incorporated on a single die area.

In semiconductor fabrication, silicon dioxide ($SiO_2$) is commonly used as a gate dielectric formed as a thin layer overlying a silicon substrate in the formation of various semiconductor devices including metal-oxide-semiconductor (MOS) transistors. As device dimensions have been scaled down, the thickness of the $SiO_2$ layer has also decreased to maintain the same capacitance between the gate electrode and channel regions. A gate oxide layer thickness of less than about 20 Angstroms is frequently a standard design limitation for 0.13 micron and smaller integrated circuit microelectronic fabrication to achieve required capacitances.

With the formation of thinner gate oxides, the presence of defects, including point and line defects (dislocations) at the oxide/silicon interface become more important as such defects form charge trapping and interfacial states which more readily alter the functioning of the semiconductor device. In prior art integrated circuit fabrication processes, a thin $SiO_2$ layer, also referred to as a pad oxide, initial oxide, or sacrificial oxide, is thermally grown over exposed portions of a silicon substrate having a thickness of about 100 to 150 Angstroms. The sacrificial oxide serves several purposes including protecting the underlying silicon substrate from chemical contamination during subsequent processing steps, for example, acting as an etch stop during phosphoric acid stripping of an overlying nitride layer following shallow trench isolation (STI) formation. In addition, sacrificial oxide layers protect the silicon from excessive damage during ion implantation steps by controlling the depth of ion implantation and reducing ion channeling effects. Further, sacrificial oxide layers act to relieve induced stresses and defects present in the underlying silicon substrate. For example following an STI etching process a sacrificial oxide layer is deposited within the trenches to remove surface defects and improve the interface between the oxide and the silicon substrate.

Common in the art of semiconductor integrated circuit microelectronic fabrication processes is the formation of sacrificial oxide layers which are thermally grown at temperatures from about 800° C. to about 1000° C., for example by rapid thermal oxidation (RTO) processes to minimize the time at elevated temperatures which tends to cause the formation of defects such as dislocations at the $SiO_2$/silicon interface. Typically sacrificial oxide layers are formed at elevated temperatures and removed prior to the formation of the gate oxide thereby avoiding any significant impact on thermally sensitive regions such as subsequently formed doped regions including LDD regions and source/drain regions. For example, ion implantations to form doped regions typically include several carefully controlled ion implantations at pre-determined depths followed by carefully controlled annealing processes to distribute the dopants. The formation of sacrificial oxide layers at typical elevated temperatures following the formation of doped regions would detrimentally alter the electrical functioning of the semiconductor device. In addition, the formation of sacrificial oxide layers prior to gate oxide formation tends to contribute to defect formation at the gate/oxide interface to detrimentally affect gate oxide integrity (GOI) by creating trapping and interfacial charged states which alter device functioning. In addition, dielectric breakdown of the gate oxide may occur at lower values of gate voltage as a result of defects at the silicon/SiO2 interface.

Also common in the art of semiconductor integrated circuit microelectronic fabrication is the fabrication of embedded DRAM and SRAM devices logic devices and memory devices are simultaneously incorporated requiring the formation of doped regions prior to the formation of the gate oxide. In this respect, the thermal budget, defined as the integrated time a semiconductor process wafer is at a particular temperature is necessarily restricted to avoid inducing undesirable diffusion of implanted dopants in doped regions to thereby detrimentally alter the electrical functioning of the device. For example, it is preferable to limit the maximum temperature the device is exposed to elevated temperatures prior to gate formation to not more than about 650° C. As a result, conventional methods to form thermally grown oxides at temperatures exceeding about 650° C. are unacceptable requiring new processing methods with lower thermal budgets to form sacrificial oxide layers.

Therefore it would be advantageous to develop a method in the semiconductor integrated circuit microelectronic fabrication are for forming sacrificial silicon dioxide layers using a lower thermal budget manufacturing process.

It is therefore an object of the invention to provide a method in the semiconductor integrated circuit microelectronic fabrication art for forming sacrificial silicon dioxide layers using a lower thermal budget manufacturing process while overcoming other limitations and shortcomings of the prior art.

SUMMARY OF THE INVENTION

To achieve the foregoing and other objects, and in accordance with the purposes of the present invention, as embodied and broadly described herein, the present invention provides a method for forming a silicon dioxide layer over a silicon substrate.

In a first embodiment, the method includes providing a substrate having exposed silicon portions; and forming a silicon dioxide layer over the exposed silicon portions according to an oxide formation process including contacting the exposed silicon portions with an oxidizing solution comprising water and ozone.

In related embodiments, the method includes removing at least a portion of the silicon dioxide layer according to an oxide removal process comprising contacting the silicon dioxide layer with an oxide etching solution and sequentially repeating the oxide formation process and the oxide removal process to form newly exposed silicon portions.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to and is particularly advantageous for the formation of sacrificial oxide layers over a silicon substrate, it will be appreciated that the method of the present invention is in general applicable to the growth of oxide layers overlying a substrate where oxygen species is transported to and reacts with the underlying substrate to partially grow an oxide layer into the substrate including partially growing the oxide layer to a thickness over the substrate whereby sequentially growing and removing the oxide layer incrementally removes a portion of the substrate surface including defect containing portions.

In addition it will be appreciated that the term sacrificial oxide as used herein is meant to include a silicon dioxide layer used in a semiconductor integrated circuit fabrication process for purposes including substrate protection, e.g., pad oxide, barrier oxide, initial oxide, and etch stop layer, substrate surface smoothing, e.g., pad oxide, trench liner oxide, structure formation, e.g., masking layer, ion implantation screening or ion channeling inhibition layer, and the like. It will be appreciated that other semiconductor integrated circuit fabrication processes may advantageously utilize the concept of the present invention.

In a first embodiment of the invention, in an optional first step one or more semiconductor process wafers including a process surface having exposed silicon portions are subjected to a wet bench process to remove a native silicon oxide layer formed over the exposed silicon surfaces. For example, typically a thin silicon dioxide layer will form over the silicon surface by partially growing into the silicon surface, for example having a thickness of less than about 10 Angstroms thick upon exposure to an oxygen containing atmosphere. The wet oxide removal process preferably includes at least a dipping process and preferably a simultaneous scrubbing process.

Figure 1:
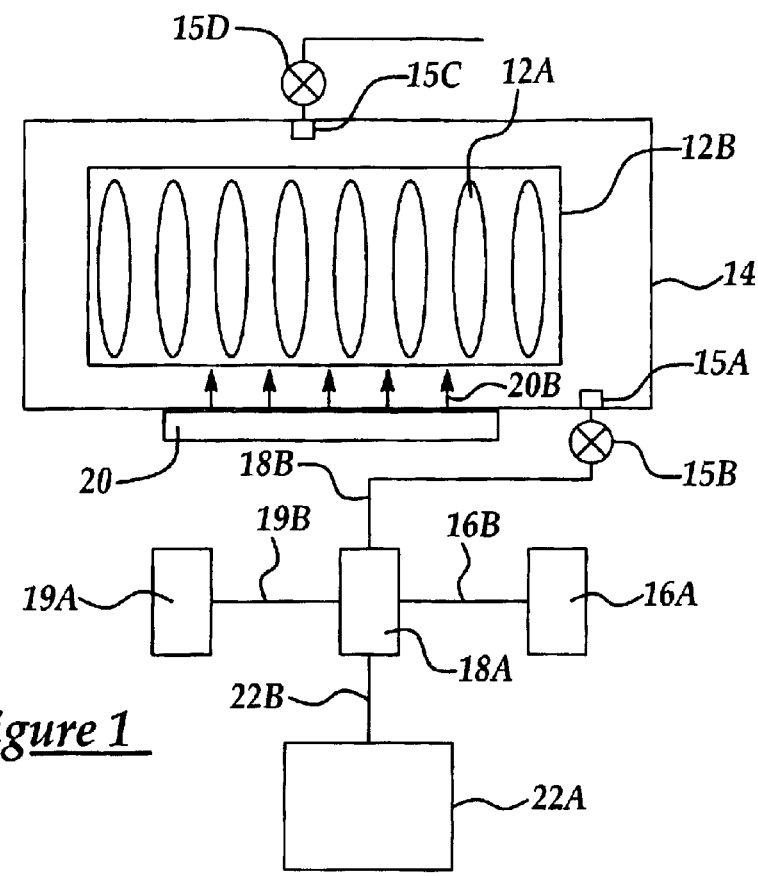
FIG. 1 is a schematic representation of an exemplary apparatus for implementing embodiments of the present invention.

For example, referring to FIG. 1, a batch of semiconductor wafers e.g., 12A, are positioned in wafer holding means 12B within a closed vessel 14 containing an oxide removal solution provided to cover (immerse) the semiconductor wafers. Preferably, the oxide removal solution is provided to vessel 14 through inlet means 15A, for example including an injection valve 15B and includes outlet means 15C, for example including a venting valve 15D for removing overflow liquid or gas generated during the treatment process. In a preferred embodiment, the oxide removal solution is dilute hydrofluoric (hydrogen fluoride) (HF) acid, diluted with water, preferably deionized water, with a volumetric ratio of deionized water to HF of about 100 to 1 to about 450 to 1 with respect to a given solution volume. Preferably, the oxide removal solution is injected into the vessel 14 to cover the semiconductor wafers at a flow rate of about 10 to about 30 GPM (Gallons per minute) followed by a soaking time of about 100 to about 200 seconds. Preferably the Temperature of the HF solution is at a temperature of about 23 ° C. to about 100° C., more preferably about 23° C. to about 80° C. In operation, the oxide removal solution is provided from solution source 16A through feed line 16B to mixer 18A where it is optionally pre-heated, then supplied to vessel 14 through feed line 18B and injection valve 15B to cover the semiconductor wafers at a predetermined flow rate. The semiconductor wafers e.g., 12A are then soaked in the solution for a predetermined period of time.

Still referring to FIG. 1, in another embodiment, the oxide removal process includes simultaneously applying an ultrasonic scrubbing energy source, for example a megasonic energy source to the oxide removal solution. For example megasonic energy source 20 is positioned adjacent the vessel 14 exterior such that the megasonic energy, indicated by directional arrows e.g., 20B, is directed parallel to the semiconductor wafer process surfaces during at least the soaking step.

Still referring to FIG. 1, following the oxide removal process, the oxide removal solution is removed from the vessel 14 and the vessel filled with deionized water to rinse the wafers, again optionally including simultaneously applied megasonic scrubbing. Preferably the deionized water during the rinse process is provided at a temperature of about 23° C. to about 100° C., more preferably about 23° C. to about 80° C. It will be appreciated the rinsing process may be carried out more than once it desired. In operation, deionized water source 19A provides water to mixer 18A through feed line 19B for optional pre-heating which is then supplied through feed line 18B and injection valve 15B to vessel 14A to cover the wafers followed by a soaking process with optional simultaneous application of megasonic energy from megasonic energy source 20.

Following the rinsing process the semiconductor wafers are subjected to an ozonated water oxide formation process. For example, still referring to FIG. 1, a source of ozone, for example a conventional ozone generator 22A provides ozone gas upstream from the injection valve 15B, for example to mixer 18A, where the ozone and deionized water supplied from deionized water source 16C are pre-mixed and optionally preheated prior to injection into the treatment vessel 14A. Preferably, the ozone is controllably supplied through feed line 22B according to an automated flow rate controller, for example, a mass flow controller (not shown), to mixer 18A to preferably form a mixture of ozone and deionized water having a concentration of ozone of about 10 PPMV to about 200 PPMV (volume parts per million) with respect to a given mixture volume. More preferably, the mixture of ozone and deionized water is saturated with ozone, meaning that the solubility limit of ozone in deionized water is about reached, or in other words, an ozone concentration at about the solubility limit of ozone in water. The vessel 14 optionally includes a heating means, for example a resistive heating element (not shown) to maintain a solution temperature within the vessel. Preferably, the mixture of ozone and deionized water (ozonated solution) is provided to the vessel 14 at a temperature of about of about 23° C. to about 100° C., more preferably about 23° C. to about 80° C. Preferably, the ozonated solution is controllably provided to vessel 14 from mixer 18A, by a flow control means at a flow rate of about 4 GPM to about 10 GPM, more preferably about 6 GPM, through injection valve 15B, to cover the semiconductor wafers, followed by a soaking time period of about 120 seconds to about 200 seconds. In a preferred embodiment, the megasonic energy source 20 is simultaneously applied during at least the soaking period.

In one embodiment, the ozonated water oxide formation process, following the optional initial step of removal of a native oxide, and the subsequent oxide removal process to remove the sacrificial oxide layer form a process cycle which is repeated at least once with the oxide removal process being the final step. More preferably, the process cycle is repeated at least twice. Preferably the silicon dioxide layer (sacrificial oxide layer) is grown to a thickness of about 5 to about 100 Angstroms. It has been found, however, that the growth rate of the silicon dioxide layer dramatically slows at about 15 Angstroms due to kinetic factors believed to be related to slowed oxygen transport times through the silicon dioxide layer. For example, it is believed oxygen is transported to the silicon/oxide interface where silicon dioxide is formed by reacting with silicon, thereby partially growing into the silicon surface. In a preferred embodiment, megasonic energy is applied during the oxide formation process to since it is believed the megasonic energy source advantageously acts to increases the rate of oxygen transport to the silicon/oxide interface.

Advantageously, it has been found that repeating the process cycle including the ozonated water oxide formation process and oxide removal process, that a surface portion of the silicon substrate from which the sacrificial oxide layer is grown during the oxide formation process, is sequentially removed in the process cycle, for example surface portions including defects from previous processing conditions. By sequentially repeating the process cycle to first form the sacrificial oxide layer and then remove at least a portion of the sacrificial oxide layer, or example from about 5 Angstroms to about 15 Angstroms, a newly formed underlying silicon portion is provided with a reduced level of defects thereby improving a subsequent gate oxide formation process where the gate oxide formed over the newly formed underlying silicon portion has improved electrical property characteristics.

Figure 2:
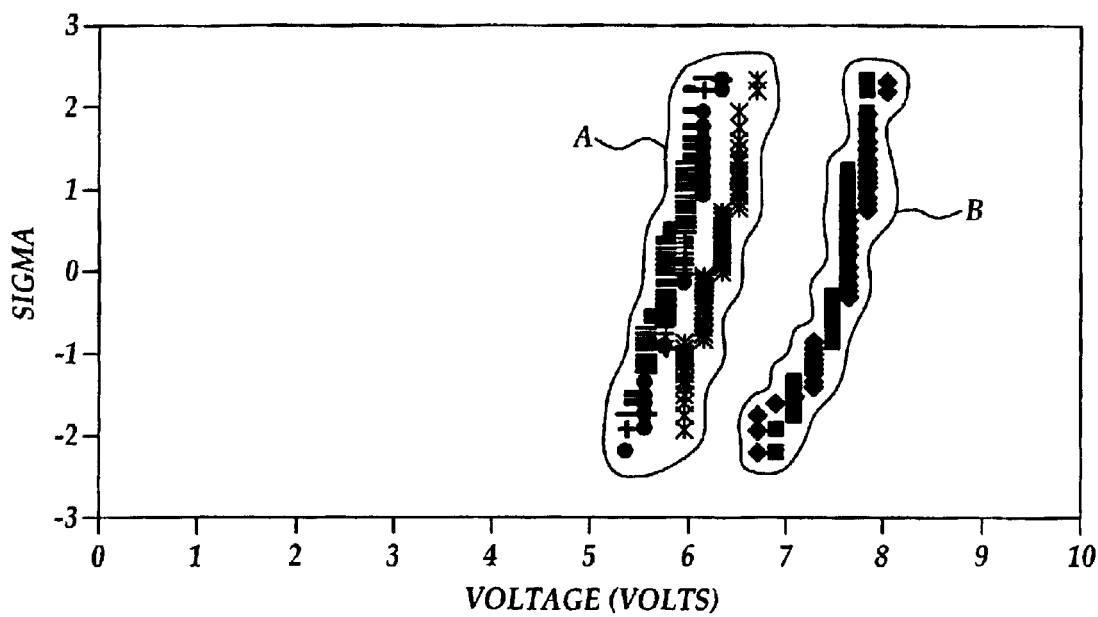
FIG. 2 is a representation of relative dielectric breakdown voltages of exemplary semiconductor devices formed according to an embodiment of the invention compared with devices formed using alternative processes including prior art processes.

For example referring to FIG. 2 is representative data showing gate oxide breakdown voltage improvements in an exemplary NMOS device where the gate oxide is formed over a silicon substrate following about two process cycles according to preferred embodiments of the present invention compared to a conventionally frown gate oxide. For example shown on the vertical axis is a statistical value, sigma, representing a variation among several semiconductor devices subjected to a gate oxide dielectric breakdown test, while shown on the horizontal axis is the applied voltage at gate oxide dielectric breakdown. The gate oxide dielectric breakdown voltage is representative of gate oxide integrity (GOI), for example a higher breakdown voltage corresponds with improved GOI. Data area A represents the breakdown voltages for devices formed according to conventional sacrificial oxide layer growth processes and conventional gate oxide formation processes while data area B represents the breakdown voltages for devices formed including a sacrificial oxide layer formed with the ozonated water oxide formation and removal process cycle according to preferred embodiment of the present invention prior to formation of a gate oxide by conventional processes. It is seen that the process cycle according to preferred embodiments improves gate oxide integrity as indicated by data within area B having higher gate oxide breakdown voltages. The results are similar for both NMOS and PMOS devices.

Figure 3:
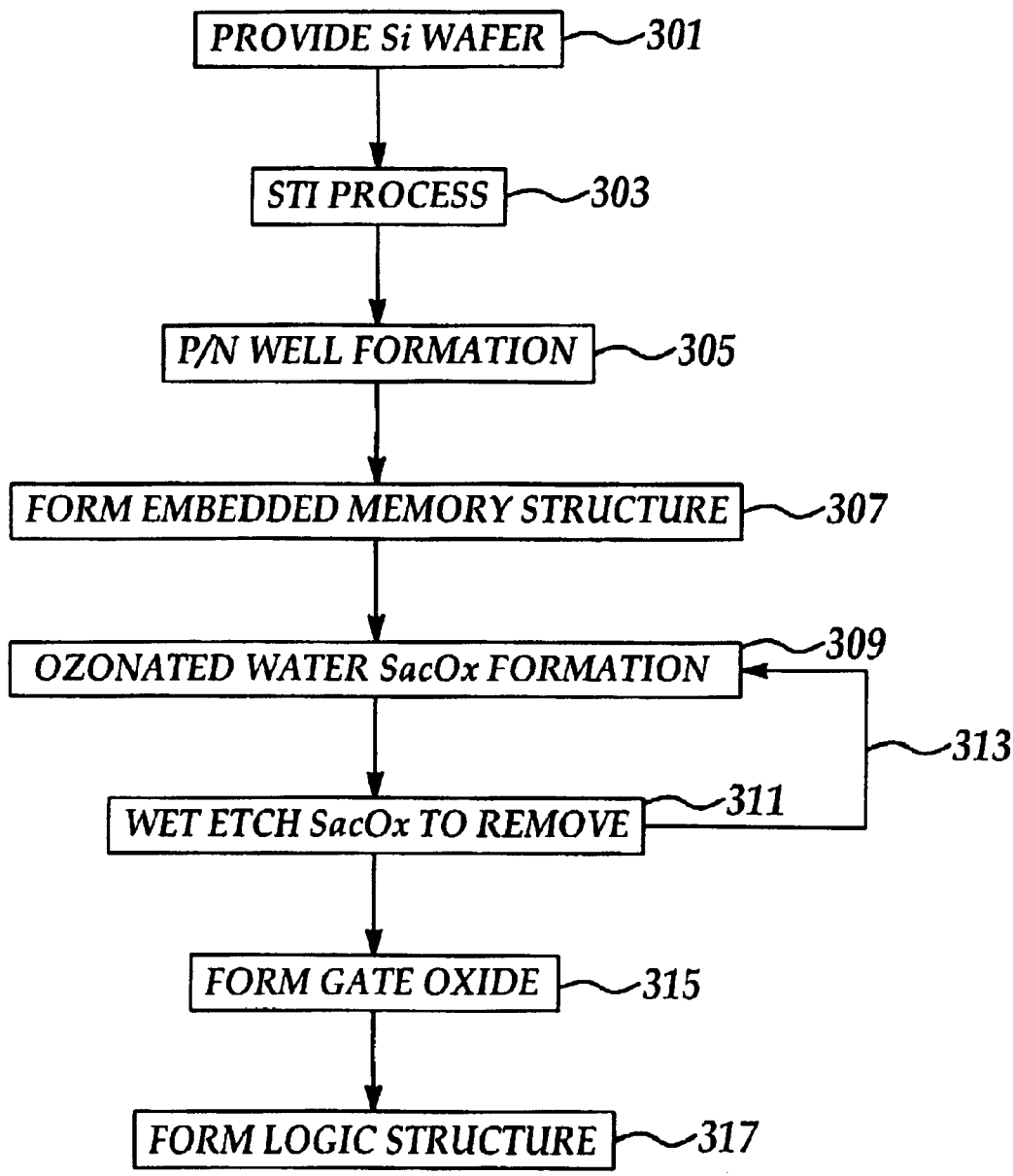
FIG. 3 is a process flow diagram including an exemplary implementation of the present invention including several embodiments.

Referring to FIG. 3 is a process flow diagram including several embodiments of the present invention. In an exemplary implementation of the present invention an embedded memory structure, for example a DRAM device formation process is integrated with a logic device formation process to form an integrated memory and logic device the formation of such devices known in the art. For example, in process 301, a silicon wafer having a process surface is provided; in process 303 a conventional shallow trench isolation process is carried out to form isolation trenches in the silicon wafer surrounding active device areas followed by process 305 where a conventional N-well and P-well formation process is carried out including ion implantation. In process 307, conventional processing steps to form in an embedded memory structure, for example, a DRAM structure, are carried out. In process 309, a sacrificial oxide layer is formed over exposed portions of the silicon substrate according to preferred embodiments of the ozonated water oxide formation process. Optionally, although not shown, a native oxide layer is removed prior to formation of the sacrificial oxide layer according to preferred embodiments. In process 311, at least a portion of the sacrificial oxide layer is removed according to preferred embodiments of the oxide removal process. As indicated by process direction arrow 313, processes 309 and 311 are repeated at least once, more preferably at least twice to form a newly exposed silicon substrate portion. In process 315, a conventional gate oxide formation process is carried out, for example to form gate oxide structures over exposed portions of the silicon substrate, for example having a thickness from about 20 Angstroms to about 60 Angstroms. In process 317, conventional steps are followed to form the logic structures to form an integrated memory and logic device.

While the embodiments illustrated in the Figures and described above are presently preferred, it should be understood that these embodiments are offered by way of example only. The invention is not limited to a particular embodiment, but extends to various modifications, combinations, and permutations as will occur to the ordinarily skilled artisan that nevertheless fall within the scope of the appended claims.

What is claimed is:

1. A method for forming a silicon dioxide layer over a silicon containing substrate to remove defective silicon portions comprising the steps of:

providing a substrate having exposed silicon portions;

forming a silicon dioxide layer over the exposed silicon portions according to an oxide formation process comprising contacting the exposed silicon portions with an oxidizing solution comprising water and ozone; and, removing the silicon dioxide layer according to an oxide removal process comprising contacting the silicon dioxide layer with an oxide etching solution to form newly exposed silicon portions.

2. The method of claim 1 further including the step of sequentially repeating the oxide formation process and the oxide removal process at least once.

3. The method of claim 1, wherein the oxide etching solution comprises hydrofluoric (HF) acid.

4. The method of claim 3, wherein oxide etching solution comprises a volumetric ratio of water to HF with respect to a treatment solution volume of about 100 to 1 to about 450 to 1.

5. The method of claim 1, wherein the oxidizing solution comprises an ozone concentration of about 10 to about 200 volume part per million with respect to the oxidizing solution volume.

6. The method of claim 1, wherein the oxidizing solution comprises an ozone concentration at about a solubility limit of ozone in water.

7. The method of claim 1, wherein the step of forming a silicon dioxide layer comprises immersion of the substrate in the oxidizing solution while simultaneously applying ultrasonic energy to the oxidizing solution.

8. The method of claim 1, wherein the silicon dioxide layer is formed having a thickness of from about 5 Angstroms to about 100 Angstroms.

9. The method of claim 1, wherein the silicon dioxide layer is a sacrificial oxide formed over a silicon semiconductor wafer substrate.

10. The method of claim 1, further comprising the step of forming a gate oxide-over the newly exposed silicon portions.

11. The method of claim 10, wherein the gate oxide has a thickness of from about 20 Angstroms to about 60 Angstroms.

12. The method of claim 1, wherein the substrate comprises an ion implanted silicon substrate.

13. The method of claim 1, wherein the step of forming a silicon dioxide layer is carried out at temperatures less than about 100 degrees Centigrade.

14. The method of claim 1, further comprising the step of removing native oxide from the exposed silicon portions prior to the step of forming a silicon dioxide layer.

* * * * *